United States Patent [19]

Viscuso

[11] Patent Number: 4,785,638
[45] Date of Patent: Nov. 22, 1988

[54] REFRIGERANT FLUID TRAP FOR VACUUM EVAPORATORS FOR THE DEPOSIT OF THIN METAL FILMS

[75] Inventor: Orazio Viscuso, Catania, Italy

[73] Assignee: SGS-Thompson Microelectronics S.p.A., Catania, Italy

[21] Appl. No.: 71,909

[22] Filed: Jul. 10, 1987

[30] Foreign Application Priority Data

Aug. 6, 1986 [IT] Italy ................................ 21421 A/86

[51] Int. Cl.$^4$ .............................................. B01D 8/00
[52] U.S. Cl. ......................................... 62/55.5; 55/269; 62/268; 219/121.33; 417/901
[58] Field of Search ........................ 62/55.5, 100, 268; 55/269; 417/901; 219/121 EZ

[56] References Cited

U.S. PATENT DOCUMENTS

| | | | |
|---|---|---|---|
| 3,144,200 | 8/1964 | Taylor et al. | 62/55.5 |
| 3,220,167 | 11/1965 | Van Der Ster et al. | 62/55.5 |
| 3,252,291 | 5/1966 | Eder | 62/55.5 |
| 3,472,039 | 10/1969 | Hait | 62/55.5 |
| 3,769,806 | 11/1973 | Boissin et al. | 62/55.5 |
| 4,488,506 | 12/1984 | Heinecke et al. | 62/55.5 |
| 4,599,869 | 7/1986 | Ozin et al. | 62/55.5 |

Primary Examiner—Ronald C. Capossela
Attorney, Agent, or Firm—Cushman, Darby & Cushman

[57] ABSTRACT

A refrigerant fluid trap for a vacuum evaporator for depositing a thin metal film including a U-shaped structure for passage of refrigerant fluid, forming an interior space for trapping condensable vapors. In said interior space there is housed a titanium evaporation source.

3 Claims, 2 Drawing Sheets

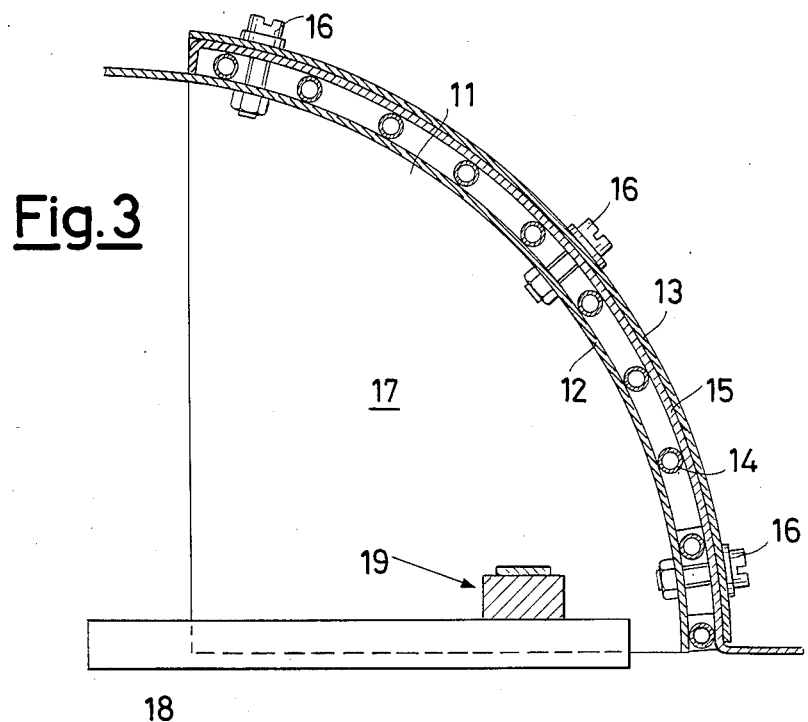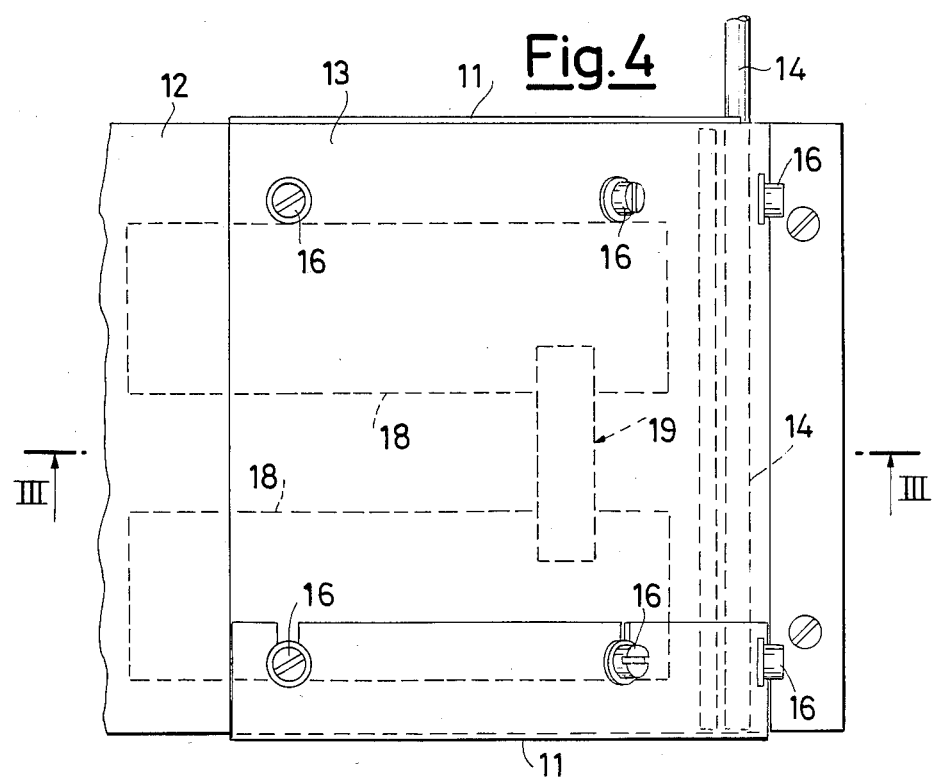

REFRIGERANT FLUID TRAP FOR VACUUM EVAPORATORS FOR THE DEPOSIT OF THIN METAL FILMS

BACKGROUND OF THE INVENTION

The present invention relates to a refrigerant fluid trap for vacuum evaporators for the deposit of thin metal films.

Evaporators for the above use are known which include, in a vacuum chamber, a source of evaporation of the electronic gun, boat or filament type placed in front of the receiving substrate.

A suitable gettering trap is also included in said evaporators to capture the condensable vapors (water or other) and any possible contaminants which could otherwise compromise the vacuum state and hence deposit of the desired metal.

The traps presently in use are generally formed of coils of copper tubing through which runs refrigerant fluid which causes them to act as cold walls exposed to the condensable vapors.

A shortcoming of known traps is represented by their inability to operate in close contact with the source of evaporation because of their conformation as indicated above. As a result, trapping efficiency is not high.

SUMMARY OF THE INVENTION

The object of the present invention is to achieve a refrigerant fluid trap which, for a given size, would have higher trapping efficiency.

In accordance with the invention, said object is achieved by a trap characterized in that it comprises a structure for passage of refrigerant fluid forming an interior trapping space for the condensable vapors.

Preferably in said interior space, there is housed a titanium evaporation source which considerably increases gettering properties toward residual gasses such as oxygen, nitrogen and others.

DESCRIPTION OF THE DRAWINGS

Two possible forms of embodiment of the trap in accordance with the invention are illustrated as examples in the annexed drawings wherein:

FIG. 3 shows a vertical cross-section of a second trap in accordance with the invention along line III—III of FIG. 4, and FIG. 4 shows a top plan view of the trap of FIG. 3.

DESCRIPTION OF PREFERRED EMBODIMENTS

Figure 1:
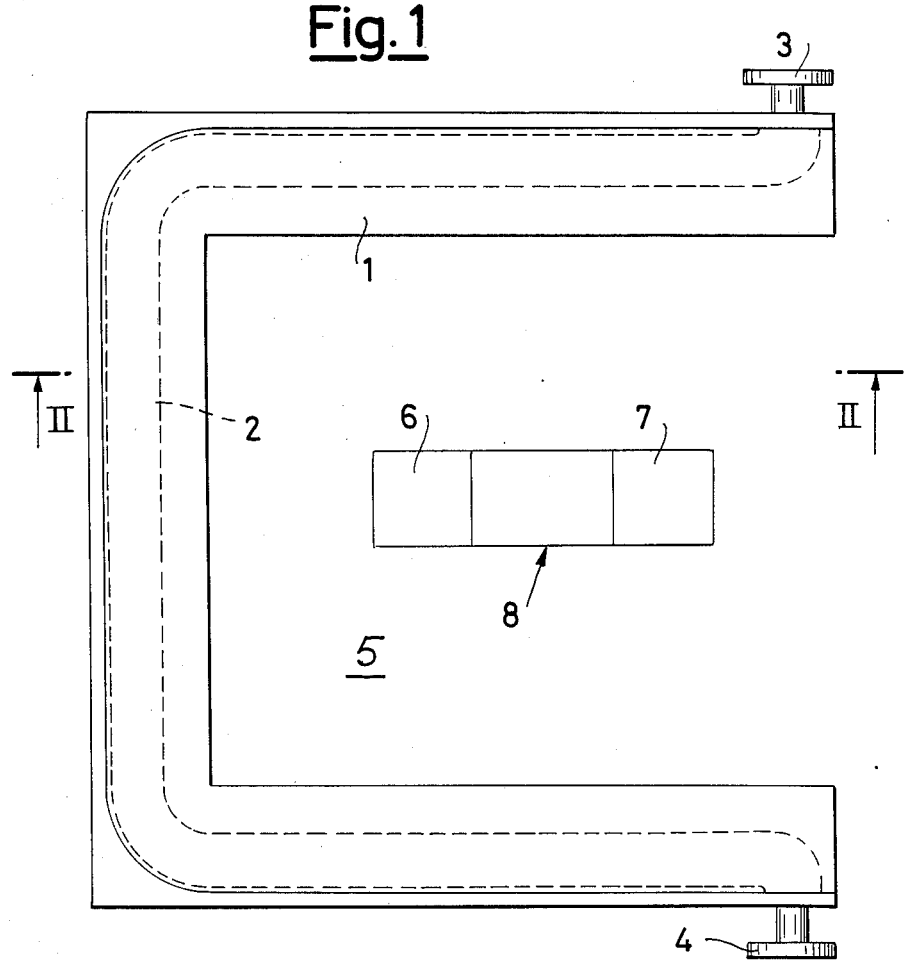
FIG. 1 shows a top plan view of a first trap in accordance with the invention.
Figure 2:
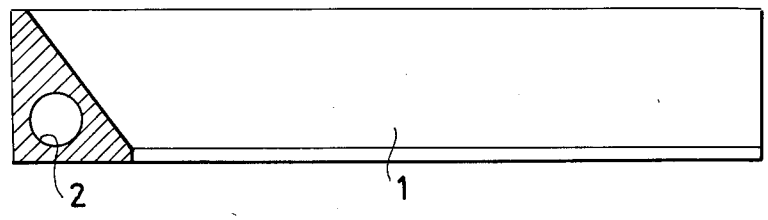
FIG. 2 shows a cross-section of said trap along line II—II of FIG. 1.

FIGS. 1 and 2 show a trap usable either with a boat supply source, a filament supply source or an electron gun supply source.

It has a U-shaped structure 1 through which passes a duct 2 designed for the passage of a refrigerant fluid, in particular, liquid nitrogen. Reference numbers 3 and 4 indicate the inlet and outlet openings of the duct 2.

The U-shaped structure 1 forms an interior space 5 in which can be housed an evaporation source of metal to be deposited and an evaporation source of titanium designed to help the trapping of oxygen, nitrogen and other residual gases by the cold walls of the trap.

In the example illustrated, the two sources are indicated with reference numbers 6 and 7 and assumed to be associated with a boat evaporator 8.

The trap shown in FIGS. 1 and 2 can be used in a vacuum evaporator inside a suitable bell-shaped vacuum chamber and in front of a silicon substrate designed to receive the evaporated metal.

Circulation of the refrigerant fluid in the duct 2 causes the peripheral structure 1 of the trap to behave as a cold chamber, causing condensation of condensable vapors such as water. As mentioned above, the titanium evaporated from the source 7 helps trapping of residual gases such as oxygen and nitrogen.

FIGS. 3 and 4 show a trap designed to be used basically as a boat-type or filament-type supply source.

It has a structure formed of two side walls 11 (not essential), an interior screen 12 and an exterior screen 13, in the form of a circle-segment vault and, between the screens 12 and 13 a coiled tube 14 for passage of the refrigerating fluid. The tube 14 is supported by an arched plate 15. Screws 16 hold said structure together.

The above-described structure forms an interior space 17 in which is housed, on a pair of plates 18, a titanium evaporation source 19 of the boat type.

The trap shown in FIGS. 3 and 4 is also usable in a bell-shaped vacuum evaporator. In this case, however, the trap must be arranged laterally in relation to the evaporation source of the metal to be deposited so as not to interfere therewith.

The main advantages of the traps illustrated in the drawings and, in general, of the trap in accordance with the invention may be summarized, as follows: (a) the enveloping form with an interior space allows the trap to operate in close contact with the evaporation source of the metal to be deposited; (b) it is possible to vary the extent of the active surface, e.g. by providing it with fins, to increase condensation efficiency toward water or other condensable vapors; (c) coupling to a titanium source makes it possible to trap residual gasses such as oxygen and nitrogen, thus obtaining a very high and particularly clean (free of contaminants) vacuum and with low oxygen content; and (d) the getter effect appears, predominantly for oxygen, in the presence of evaporation sources of nickel, chromium or other elements having an affinity with oxygen, since the trap behaves as a cold wall.

I claim:

1. A refrigerant fluid trap for a vacuum evaporator for depositing a thin film onto a substrate, comprising:
    a U-shaped structure including a base and two laterally-spaced limbs each having a free end and an end joined with a respective end of the base, whereby a trapping space is defined laterally intermediate said limbs of said U-shaped structure;
    means defining an internal duct in said U-shaped structure, including an inlet, an outlet, and respective portions extending on said base and said limbs whereby, as refrigerant fluid is circulated in said internal duct, said trapping space functions as a cold chamber; and
    an evaporation source for a metal to be deposited on a substrate, said evaporation source being disposed in said trapping space.

2. The refrigerant fluid trap of claim 1, further including:
    an auxiliary, titanium evaporation source for trapping at least one of oxygen, nitrogen and other residual gases, said auxiliary evaporation source also being disposed in said trapping space.

3. The refrigerant fluid trap of claim 1, further including:
an auxiliary evaporation source for trapping oxygen also being disposed in said trapping space; said auxiliary evaporation source being made of at least one of nickel and chromium.

* * * * *

UNITED STATES PATENT AND TRADEMARK OFFICE
CERTIFICATE OF CORRECTION

PATENT NO. : 4,785,638

DATED : November 22, 1988

INVENTOR(S) : Orazio Viscuso

It is certified that error appears in the above-identified patent and that said Letters Patent is hereby corrected as shown below:

ON THE FIRST INFORMATION PAGE:

Please change

"(73) Assignee:   SGS-Thompson Microelectronics S.p.A."
to
--(73) Assignee:   SGS-Thomson Microelectronics S.p.A.--

Signed and Sealed this

Twentieth Day of June, 1989

Attest:

DONALD J. QUIGG

Attesting Officer

Commissioner of Patents and Trademarks